(12) United States Patent
Cho et al.

(10) Patent No.: US 10,529,879 B2
(45) Date of Patent: Jan. 7, 2020

(54) PHOTOELECTRIC CONVERSION DEVICE INCLUDING QUANTUM DOT LAYERS

(71) Applicants: SAMSUNG ELECTRONICS CO., LTD., Suwon-si (KR); CHEONGJU University Industry & Academy Cooperation Foundation, Cheongju-si (KR)

(72) Inventors: Kyungsang Cho, Gwacheon-si (KR); Sangyeol Lee, Cheongju-si (KR); Chanwook Baik, Yongin-si (KR)

(73) Assignees: SAMSUNG ELECTRONICS CO., LTD., Suwon-si (KR); CHEONGJU University Industry & Academy Cooperation Foundation, Cheongju-si (KR)

(*) Notice: Subject to any disclaimer, the term of this patent is extended or adjusted under 35 U.S.C. 154(b) by 0 days.

(21) Appl. No.: 15/990,174

(22) Filed: May 25, 2018

(65) Prior Publication Data

US 2019/0189815 A1    Jun. 20, 2019

(30) Foreign Application Priority Data

Dec. 18, 2017   (KR) .......................... 10-2017-0174160

(51) Int. Cl.
*H01L 31/0352*   (2006.01)
*H01L 31/0224*   (2006.01)
(Continued)

(52) U.S. Cl.
CPC .. *H01L 31/035218* (2013.01); *H01L 31/0336* (2013.01); *H01L 31/1129* (2013.01)

(58) Field of Classification Search
CPC ..... H01L 31/035218; H01L 31/035236; H01L 31/035245; H01L 31/035209;
(Continued)

(56) References Cited

U.S. PATENT DOCUMENTS 8,455,881 B2   6/2013 Arkun et al.
8,653,518 B2   2/2014 Makihara et al.
(Continued)

FOREIGN PATENT DOCUMENTS

KR     10-1189686 B1     10/2012
KR     20120107731 A  *  10/2012    ..... H01L 31/035218
(Continued)

OTHER PUBLICATIONS

Beard, et al., "Size-Dependent Photoconductivity in CdSe Nanoparticles as Measured by Time-Resolved Terahertz Spectroscopy", Aug. 14, 2002, Nano Letters, vol. 2, No. 9, 5 pages total.

*Primary Examiner* — Zandra V Smith
*Assistant Examiner* — Jeremy J Joy
(74) *Attorney, Agent, or Firm* — Sughrue Mion, PLLC

(57) ABSTRACT

A photoelectric conversion device may include a substrate, a photoactive layer disposed on the substrate, and a first electrode and a second electrode respectively connected to corresponding edges of the photoactive layer. The photoactive layer may include a first oxide semiconductor layer on the substrate, and a plurality of quantum dot layers and a plurality of second oxide semiconductor layers that are alternately formed on the first oxide semiconductor layer.

14 Claims, 5 Drawing Sheets

(51) Int. Cl.
*H01L 31/0336* (2006.01)
*H01L 31/09* (2006.01)
*H01L 31/112* (2006.01)
*H01L 31/113* (2006.01)

(58) Field of Classification Search
CPC . H01L 31/0336–03365; H01L 31/0272; H01L 31/0296; H01L 31/02966; H01L 31/0304; H01L 31/03044–03048; H01L 31/0324; H01L 31/0326
See application file for complete search history.

(56) References Cited

U.S. PATENT DOCUMENTS

| | | | |
|---|---|---|---|
| 9,425,336 B2 | 8/2016 | Kim et al. | |
| 2002/0050288 A1* | 5/2002 | Suzuki | B82Y 20/00 136/255 |
| 2002/0101895 A1* | 8/2002 | Augusto | B82Y 20/00 372/44.01 |
| 2006/0220001 A1* | 10/2006 | Uetake | B82Y 10/00 257/14 |
| 2007/0120045 A1* | 5/2007 | Yokoyama | H01L 27/307 250/214 R |
| 2010/0117060 A1* | 5/2010 | Wang | B82Y 20/00 257/21 |
| 2010/0288345 A1* | 11/2010 | Huang | H01L 31/035218 136/255 |
| 2011/0277829 A1* | 11/2011 | Fafard | B82Y 10/00 136/255 |
| 2011/0278541 A1* | 11/2011 | Huang | H01L 31/02327 257/21 |
| 2011/0290310 A1* | 12/2011 | Kuramachi | B82Y 20/00 136/255 |
| 2011/0290311 A1* | 12/2011 | Fukada | H01L 31/04 136/255 |
| 2012/0097225 A1* | 4/2012 | Nomura | B82Y 20/00 136/255 |
| 2012/0111398 A1* | 5/2012 | Suto | H01L 31/035218 136/255 |
| 2012/0129294 A1* | 5/2012 | Sartorius | H01L 31/03042 438/93 |
| 2012/0285537 A1* | 11/2012 | Yoshikawa | B82Y 20/00 136/262 |
| 2013/0056705 A1* | 3/2013 | Kim | G03F 7/0002 257/13 |
| 2013/0122640 A1* | 5/2013 | Kim | H01L 31/03042 438/94 |
| 2014/0326302 A1* | 11/2014 | Arakawa | H01L 31/03042 136/255 |
| 2014/0361249 A1* | 12/2014 | Lee | H01L 31/035218 257/21 |
| 2016/0020352 A1* | 1/2016 | Konstantatos | H01L 31/035218 257/24 |
| 2016/0049536 A1* | 2/2016 | Kim | H01L 31/035218 257/14 |
| 2016/0218233 A1* | 7/2016 | Shirane | H01L 31/035218 |
| 2017/0018669 A1* | 1/2017 | Williams | H01L 31/035263 |
| 2017/0084761 A1* | 3/2017 | Cho | H01L 31/02322 |
| 2017/0117496 A1* | 4/2017 | Koh | H01L 51/502 |
| 2017/0213931 A1 | 7/2017 | Choi et al. | |
| 2018/0175241 A1* | 6/2018 | Jain | H01L 33/06 |
| 2018/0261709 A1* | 9/2018 | Okada | H01L 31/078 |
| 2018/0273841 A1* | 9/2018 | Luchinger | G02F 1/1336 |

FOREIGN PATENT DOCUMENTS

| | | |
|---|---|---|
| KR | 10-2015-0142374 A | 12/2015 |
| KR | 10-2017-0033734 A | 3/2017 |
| KR | 10-2017-0088753 A | 8/2017 |

* cited by examiner

PHOTOELECTRIC CONVERSION DEVICE INCLUDING QUANTUM DOT LAYERS

CROSS-REFERENCE TO RELATED APPLICATION

This application claims priority from Korean Patent Application No. 10-2017-0174160, filed on Dec. 18, 2017, in the Korean Intellectual Property Office, the disclosure of which is incorporated herein in its entirety by reference.

BACKGROUND

1. Field

The present disclosure relates to photoelectric conversion devices including quantum dot layers.

2. Description of the Related Art

Quantum dots are nano-crystals of a semiconductor material having a diameter of approximately 10 nm or less and are materials showing a quantum confinement effect. Although the quantum dots include hundreds of thousands of electrons or more, most of the electrons are fixedly constrained to the nucleus of an atom, and thus, the number of electrons that are not constrained is limited to about 1 to 100. In this case, an energy level of the electrons is discontinuously limited, and thus, the quantum dots exhibit electrical and optical characteristics different from a bulk semiconductor that has a continuous band.

An energy level of quantum dots varies according to the size of the quantum dots, and thus, a band gap of the quantum dots may be controlled by simply controlling the size of the quantum dots. For example, when the quantum dots are used as an optical element, a light-emitting wavelength or a light-absorbing wavelength may be controlled by controlling the size of the quantum dots.

Carrier mobility may be low in the quantum dots. However, an oxide thin film has carrier mobility greater than that of the quantum dots. In a photoelectric conversion device including a single quantum dot layer, the number of charges generated by light irradiation is lower, and thus, light responsivity of the photoelectric conversion device may be low.

SUMMARY

One or more example embodiments may provide photoelectric conversion devices including a plurality of quantum dot layers.

Additional aspects will be set forth in part in the description which follows and, in part, will be apparent from the description, or may be learned by practice of the presented embodiments.

According to an aspect of an example embodiment, a photoelectric conversion device may include a substrate; a photoactive layer on the substrate, the photoactive layer including a first oxide semiconductor layer, and a plurality of second oxide semiconductor layers and a plurality of quantum dot layers alternately formed on the first oxide semiconductor layer; and a first electrode and a second electrode respectively connected to corresponding edges of the photoactive layer.

The plurality of quantum dot layers may be arranged spaced apart from each other by a distance in a range of 5 nm to 10 nm, in a vertical direction with respect to the substrate.

The first electrode and the second electrode may be arranged on both edges of an uppermost second oxide semiconductor layer among the plurality of second oxide semiconductor layers.

Electrode regions in the plurality of quantum dot layers below the first electrode and the second electrode may be filled with an oxide semiconductor.

The plurality of quantum dot layers may include 2 to 10 quantum dot layers.

Quantum dots in each of the plurality of quantum dot layers may occupy ½ to ¾ of an area of their corresponding quantum dot layer.

Quantum dots in the plurality of quantum dot layers may include CdS, CdSe, CdTe, ZnS, ZnSe, ZnTe, ZnO, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, CdHgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe, Si, Ge, SiC, SiGe, or a combination of at least two of these materials.

Each quantum dot in the plurality of quantum dot layers may have at least one of a core structure, a core-shell structure, and a core-shell-shell structure.

Each quantum dot in the plurality of quantum dot layers may include at least one of a CdSe core structure, an InP core structure, a CdSe/CdS core-shell structure, an InP/ZnS core-shell structure, and a CdSe/CdS/ZnS core-shell-shell structure.

Each of the plurality of quantum dot layers may include double quantum dot layers that are in contact with each other.

The plurality of quantum dot layers may include a first quantum dot layer that absorbs red light, a second quantum dot layer that absorbs green light, and a third quantum dot layer that absorbs blue light, which are spaced apart from each other.

The photoelectric conversion device may further include a gate insulating layer interposed between the substrate and the first oxide semiconductor layer, wherein the substrate may function as a gate electrode.

The first oxide semiconductor layer may have a first thickness greater than a second thickness of at least one of the plurality of second oxide semiconductor layers.

The photoelectric conversion device may further include a gate insulating layer and a gate electrode that are sequentially formed on the uppermost second oxide semiconductor layer.

The uppermost second oxide semiconductor layer among the plurality of second oxide semiconductor layers may have a first thickness greater than a second thickness of the first oxide semiconductor layer and remaining second oxide semiconductor layers of the plurality of second oxide semiconductor layers.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
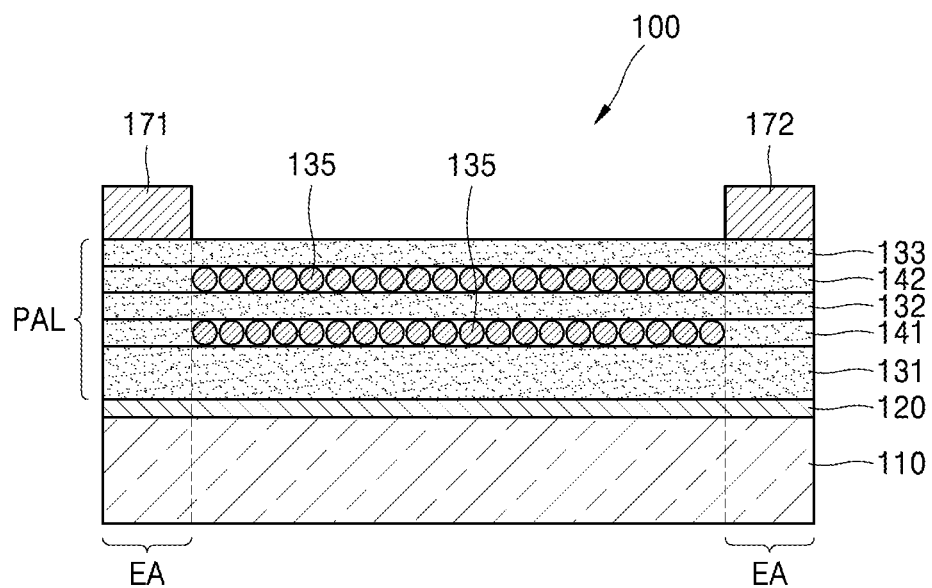
FIG. 1 is a schematic cross-sectional view showing a structure of a photoelectric conversion device including a plurality of quantum dot layers, according to an example embodiment.

Hereinafter, example embodiments will be described in detail with reference to the accompanying drawings. In the drawings, thicknesses of layers or regions may be exaggerated for clarity of the specification. The example embodiments of the present disclosure are capable of various modifications and may be embodied in many different forms.

It will be understood that when an element or layer is referred to as being "on" or "above" another element or layer, the element or layer may be directly on another element or layer or intervening elements or layers.

FIG. 1 is a schematic cross-sectional view showing a structure of a photoelectric conversion device 100 including a plurality of quantum dot layers according to an example embodiment.

Referring to FIG. 1, the photoelectric conversion device 100 may include an insulating layer 120 and a photoactive layer PAL sequentially stacked on a substrate 110. A first electrode 171 may be arranged on an edge of the photoactive layer PAL and a second electrode 172 may be arranged on the other edge of the photoactive layer PAL. The first electrode 171 and the second electrode 172 may contact the photoactive layer PAL.

The photoactive layer PAL may include a first oxide semiconductor layer 131, a first quantum dot layer 141, a second oxide semiconductor 132, a second quantum dot layer 142, and a third oxide semiconductor layer 133 that are sequentially stacked on the insulating layer 120. The first and second quantum dot layers 141 and 142 may generate charges (e.g., carriers) by absorbing light. The first and second quantum dot layers 141 and 142 include quantum dots having a predetermined size. The quantum dots may have a thickness in a range from about 1.7 nm to about 20 nm. Charges (e.g., carriers) generated from the first and second quantum dot layers 141 and 142 may be moved through the first through third oxide semiconductor layers 131, 132, and 133. The first and second quantum dot layers 141 and 142 may be spaced apart by a predetermined distance, for example, with a gap of 5 nm to 10 nm.

The first through third oxide semiconductor layers 131, 132, and 133 may provide a path for moving charges (e.g., carriers) between the first electrode 171 and the second electrode 172. The moving speed of the charges in the first and second quantum dot layers 141 and 142 may be relatively slow, but the moving speed of the charges may be relatively fast in the first through third oxide semiconductor layers 131, 132, and 133. The charges are generated in the first and second quantum dot layers 141 and 142, and the charges are transferred to the first through third oxide semiconductor layers 131, 132, and 133, and thus, a moving characteristic of the charges (e.g., carriers) is improved.

The substrate 110 may include a conductive polymer. If the substrate 110 includes a conductive polymer, it is suitable for manufacturing a flexible photoelectric conversion device 100. However, the present example embodiment is not limited thereto. The substrate 110 may include a doped silicon substrate or another metal substrate.

The insulating layer 120 may include a material used in a semiconductor process. The insulating layer 120 may include, for example, a silicon oxide or a silicon nitride. The insulating layer 120 may be an amorphous silicon oxide layer or a polymer layer, and may be used for manufacturing a flexible photoelectric conversion device 100.

The first through third oxide semiconductor layers 131, 132, and 133 may include the same material or different materials from each other. The first through third oxide semiconductor layers 131, 132, and 133 may include at least one of ZnO-based oxide, InO-based oxide, and SnO-based oxide. As another example, the first through third oxide semiconductor layers 131, 132, and 133 may include at least one of silicon indium zinc oxide (SIZO), silicon zinc tin oxide (SZTO), zinc oxide (ZnO), indium zinc oxide (IZO), zinc tin oxide (ZTO), gallium indium zinc oxide (GIZO), hafnium indium zinc oxide (HIZO), indium zinc tin oxide (IZTO), tin oxide (SnO), indium tin oxide (ITO), indium gallium oxide (IGO), indium oxide (InO), and aluminum indium oxide (AIO). Here, SIZO may be Si doped IZO, and SZTO may be Si doped ZTO. A carrier concentration of IZO and ZTO may be controlled by doping with Si, and stability and reliability thereof may also be increased.

ITO, etc. may have a semiconductive characteristic or a conductive characteristic according to a composition ratio of constituent materials (elements), and here, ITO having a semiconductor characteristic may be used. Also, SIZO, SZTO, ZnO, IZO, ZTO, GIZO, HIZO, IZTO, SnO, ITO, IGO, InO, and AIO may be expressions disregarding the composition ratio of constituent materials (elements), and the composition ratio may be appropriately determined. The first through third oxide semiconductor layers 131, 132, and 133 including the materials described above may not hardly absorb visible light, and may effectively perform a function of transferring charges generated from the quantum dot layers. The first through third oxide semiconductor layers 131, 132, and 133 may have a relatively large energy bandgap. The energy bandgap of the first through third oxide semiconductor layers 131, 132, and 133 is approximately greater than 3.0 eV, for example, in a range from about 3.0 eV to about 5.0 eV.

Also, the first through third oxide semiconductor layers 131, 132, and 133 also may have a relatively high Hall mobility, for example, greater than approximately 1 cm$^2$/Vs. The Hall mobility of the first through third oxide semiconductor layers 131, 132, and 133 may be in a range from about 1 cm$^2$/Vs to about a few hundreds of cm$^2$/Vs. For example, the Hall mobility of the first through third oxide semiconductor layers 131, 132, and 133 may be greater than 10 cm$^2$/Vs or greater than 20 cm$^2$/Vs. As a practical example, the Hall mobility of SIZO is about 30 cm$^2$/Vs. Accordingly, the first through third oxide semiconductor layers 131, 132, and 133 may have a high charge (e.g., carrier) mobility characteristic. The first through third oxide semiconductor layers 131, 132, and 133 may include an amorphous phase. The first through third oxide semiconductor layers 131, 132, and 133 may include both an amorphous phase and a crystalline phase.

The first through third oxide semiconductor layers 131, 132, and 133 may become an amorphous state by being deposited at a low temperature, and accordingly, a plastic substrate or a conductive polymer substrate may be used as the substrate 110. In order to manufacture a flexible photoelectric conversion device 100, the first through third oxide semiconductor layers 131, 132, and 133 may be in an amorphous state.

Quantum dots 135 may include a semiconductor material, for example, a group II-VI semiconductor compound, a group III-V semiconductor compound, a group IV-VI semiconductor compound, a group IV element or compound, or a combination of these materials. The group II-VI semiconductor compound may be, for example, CdS, CdSe, CdTe, ZnS, ZnSe, ZnTe, ZnO, HgS, HgSe, HgTe, or a binary compound of a combination of these compounds; CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, or a ternary compound of a combination of these compounds; and CdHgZnTe, CdZnSeS, CdZnSeTe, CdZnSTe, CdHgSeS, CdHgSeTe, CdHgSTe, HgZnSeS, HgZnSeTe, HgZnSTe, or a quaternary compound of a combination of these compounds. The group III-V semiconductor compound may be, for example, GaN, GaP, GaAs, GaSb, AlN, AlP, AlAs, AlSb, InN, InP, InAs, InSb, or a binary compound of a combination of these compounds; GaNP, GaNAs, GaNSb, GaPAs, GaPSb, AlNP, AlNAs, AlNSb, AlPAs, AlPSb, InNP, InNAs, InNSb, InPAs, InPSb, GaAlNP, or a ternary compound of a combination of these compounds; and GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a quaternary compound of a combination of these compounds. The group IV-VI semiconductor compound may be, for example, SnS, SnSe, SnTe, PbS, PbSe, PbTe, or a binary compound of a combination of these compounds; SnSeS, SnSeTe, SnSTe, PbSeS, PbSeTe, PbSTe, SnPbS, SnPbSe, SnPbTe, or a ternary compound of a combination of these compounds; and SnPbSSe, SnPbSeTe, SnPbSTe, or a quaternary compound of a combination of these compounds. The group IV element or compound may be, for example, Si, Ge, SiC, SiGe, or a combination of these compounds.

Quantum dots 135 of the first and second quantum dot layers 141 and 142 may have a core structure, a core-shell structure, or a core-shell-shell structure. The quantum dot core may have a diameter in a range from about 1 nm to about a few tens of nm according to a composition material. The quantum dot core-shell structure may be, for example, a CdSe/CdS structure or an InP/ZnS structure. The quantum dot core-shell-shell structure may be, for example, a CdSe/CdS/ZnS structure.

An oxide semiconductor may be formed on at least one of electrode regions EA that are covered by the first electrode 171 and the second electrode 172 instead of quantum dots 135 at the first and second quantum dot layers 141 and 142. For example, quantum dots of the first and second quantum dot layers 141 and 142 may be removed from the electrode regions EA and the electrode regions EA may be filled with the oxide semiconductor layer thereabove. In this case, charges are moved to edges of the quantum dot layers according to a voltage applied to the first electrode 171 and the second electrode 172, and then, charges may be readily moved to the electrodes 171 or 172 through the electrode regions EA. Thus, movements of charges may not be hindered or prevented by the presence of the first and second quantum dot layers 141 and 142.

Figure 2:
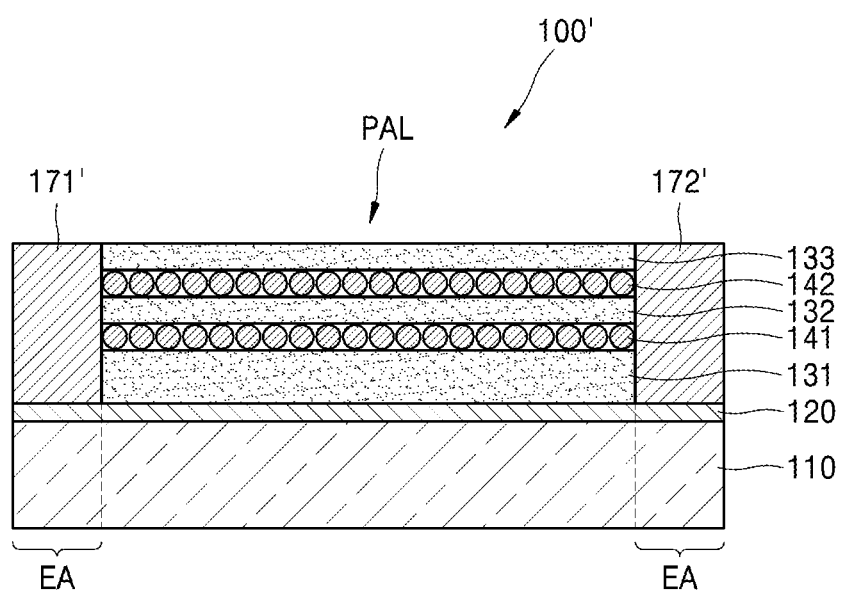
FIG. 2 is a schematic cross-sectional view showing a modified example of a structure of a photoelectric conversion device including a plurality of quantum dot layers, according to an example embodiment.

In FIG. 1, the first electrode 171 and the second electrode 172 respectively are arranged on both edges of the third oxide semiconductor layer 133, but the present example embodiment is not limited thereto. For example, FIG. 2 shows a photoelectric conversion device 100' which is a modified version of the photoelectric conversion device 100 of FIG. 1. The photoelectric conversion device 100' may include a first and second electrodes 171' and 172' that contact corresponding sides of the photoactive layer PAL. That is, the first electrode 171' and the second electrode 172' may be formed to respectively correspond to sides of a first oxide semiconductor layer 131, a first quantum dot layer 141, a second oxide semiconductor layer 132, a second quantum dot layer 142, and a third oxide semiconductor layer 133.

The first electrode 171 and the second electrode 172 may be include a metal, for example, Al, or Au using a thermal evaporation deposition method in a low temperature process.

The first and second quantum dot layers 141 and 142 may generate charges (e.g., pairs of electron holes) by absorbing light of a predetermined wavelength band. The wavelength band of light absorbed by the first and second quantum dot layers 141 and 142 may vary according to a material and/or size of a plurality of quantum dots that constitute the first and second quantum dot layers 141 and 142. Accordingly, the wavelength band of light absorbed by the first and second quantum dot layers 141 and 142 may be readily changed by controlling the material and/or size of the quantum dots. For example, CdSe, CdS, CdTe, InP, GaAs, AlSb, GaSb, InAs, InN, ZnSb, MoS, CuO. Si, etc. may be quantum dots suitable for absorbing red light; CdSe, CdS, CdTe, InP, GaAs, AlSb, GaSb, InAs, InN, ZnSb, MoS, CuO. Si, etc. may be quantum dots suitable for absorbing green light; CdSe, CdS, InP, ZnSe, MnSe, GaP, AlAs, ZnTe, MnTe, FeO, AlP, etc. may be quantum dots suitable for absorbing infrared light; and PbSe, PbS, Ge, HgSe, HgS, HgTe, InSb, SbSe, SbTe, etc. may be quantum dots suitable for absorbing infrared light.

The photoelectric conversion device 100 of FIG. 1 may be a light conductor having a two-terminal structure including the first and second electrodes 171 and 172. In the photoelectric conversion device 100, a current generated from the photoactive layer PAL by light may be sensed between the first electrode 171 and the second electrode 172, or photovoltaic characteristics of the photoactive layer PAL may allow electrical energy (i.e., electricity) to be generated. Accordingly, the photoelectric conversion device 100 of FIG. 1 may be used as a photodetector or a photovoltaic device.

According to another example embodiment, the substrate 110 of the photoelectric conversion device 100 may be formed of a conductive material, and the substrate 110 may function as a gate electrode. In this case, the photoelectric conversion device 100 may be a phototransistor. The first electrode 171 and the second electrode 172 respectively may be a source electrode and a drain electrode, and may be formed to be thicker than the first through third oxide semiconductor layers 131, 132, and 133. For example, the first oxide semiconductor layer 131 may have a thickness in a range from about 10 nm to about 20 nm, and each of the second and third oxide semiconductor layers 132 and 133 may have a thickness in a range from about 5 nm to about 10 nm. The first oxide semiconductor layer 131 may perform as a main channel, and the second and third oxide semiconductor layers 132 and 133 may perform as auxiliary channels.

A photoelectric conversion device according to an example embodiment may be used in a small device having an improved light-sensitivity, for example, a photosensor, a biosensor, or a photon detection device.

Figure 3:
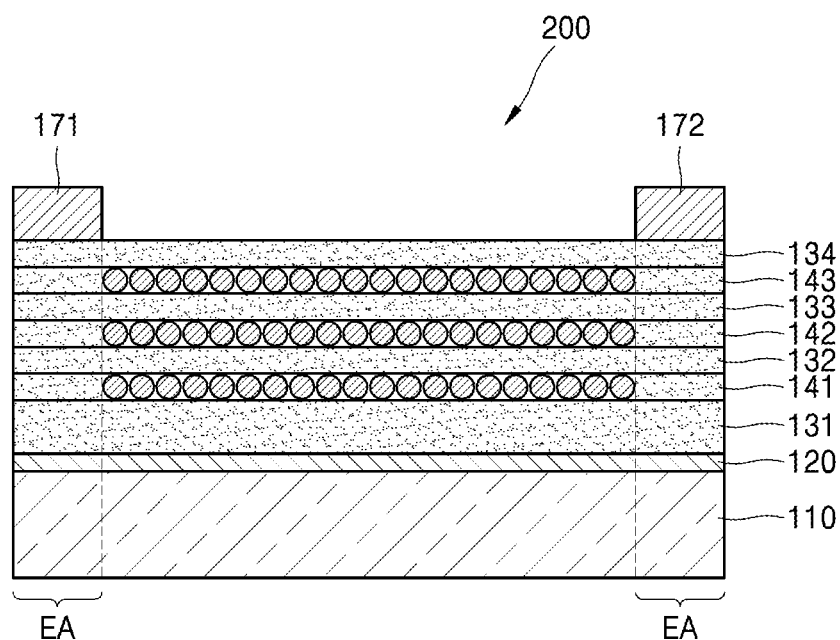
FIG. 3 is a cross-sectional view of a photoelectric conversion device according to an example embodiment.

FIG. 3 is a cross-sectional view of a photoelectric conversion device 200 according to another example embodiment. Like reference numerals are used to indicate elements that are substantially identical to the elements of FIG. 1, and thus the detailed description thereof will be omitted.

A photoactive layer PAL of the photoelectric conversion device 200 includes three layers of quantum dot layers (e.g., first through third quantum dot layers 141, 142, and 143) and four layers of oxide semiconductor layers (e.g., first through fourth oxide semiconductor layers 131, 132, 133, and 134) that are alternately arranged on a substrate 110. When the photoelectric conversion device 200 is compared with the photoelectric conversion device 100 of FIG. 1, the photoelectric conversion device 200 further includes the third quantum dot layer 143 and the fourth oxide semiconductor layer 134. A first electrode 171 and a second electrode 172 respectively may be arranged on both edges of the fourth oxide semiconductor layer 134. The third quantum dot layer 143 may have a thickness in a range from about 1.7 nm to about 20 nm, and may include the same material as the first and second quantum dot layers 141 and 142. Quantum dots in electrode regions EA of the third quantum dot layer 143 may be removed.

The fourth oxide semiconductor layer 134 may have a thickness the same as that of the second and third oxide semiconductor layers 132 and 133. The fourth oxide semiconductor layer 134 may include the same material as the first through third oxide semiconductor layers 131, 132, and 133.

An operation of the photoelectric conversion device 200 may be well understood from the operation of the photoelectric conversion device 100 of FIG. 1, and thus, the detailed description thereof will not be repeated.

The photoactive layers PAL in FIGS. 1 and 3 include a two layer structure or a three layer structure of quantum layers, but the present example embodiments are not limited thereto. For example, the photoelectric conversion device 100 according to an example embodiment may include 2 to 10 or more layers of quantum dot layers and oxide semiconductor layers that are alternately arranged with the quantum dot layers.

Figure 4:
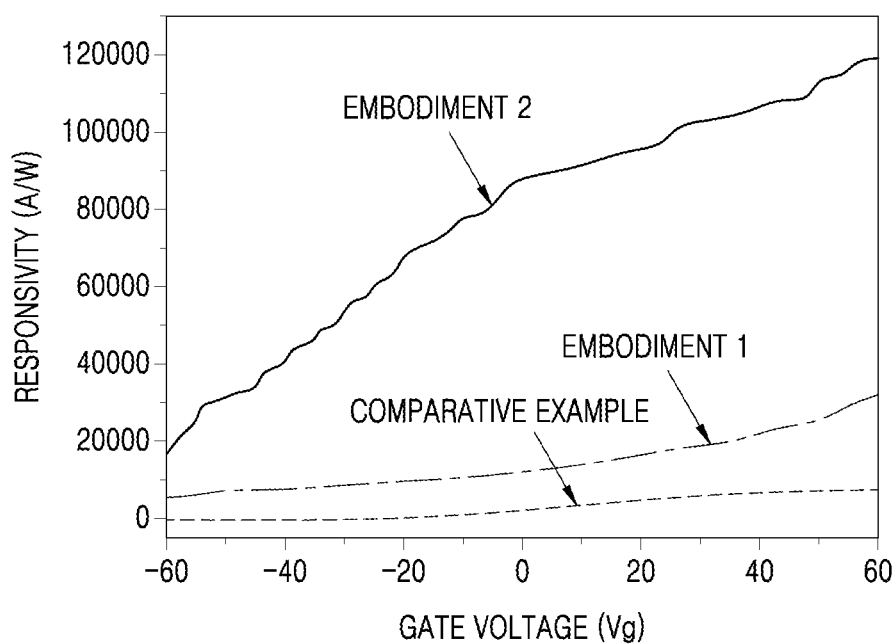
FIG. 4 is a graph showing responsivity of an optical transistor, according to another example embodiment.

FIG. 4 is a graph showing responsivity of an optical transistor according to an example embodiment. Embodiment 1 shows a characteristic of the photoelectric conversion device 100, and Embodiment 2 is a characteristic of the photoelectric conversion device 200. Comparative example shows a characteristic of an optical transistor in which the photoelectric conversion device 100 includes a single quantum dot layer. For the Embodiments 1 and 2, SIZO was used as an oxide semiconductor layer, and CdSe was used as quantum dot layers. A thickness of each of the quantum dots was approximately 5 nm, and thicknesses of the oxide semiconductor layers were approximately 40 nm, 10 nm, 10 nm, and 20 nm.

Referring to FIG. 4, it is seen that the responsivity increases according to the increase in the number of the quantum dot layers. When a gate voltage of 60 V is applied to the optical transistor, the responsivity in the comparative example is increased to 7,700 A/W, the responsivity of in the Embodiment 1 is increased to 32,000 A/W, and the responsivity of in the Embodiment 2 is increased to 120,000 A/W. The improved responsivity with the increase in the number of quantum dot layers is due to the fact that, as charges (carriers) in the quantum dots increase with the numbers of quantum dots, and charge separation efficiency increases in the quantum dots as the increase in an interface area between quantum dots and an oxide semiconductor layer, the generated (i.e., separated) charges (e.g., carriers) may be more readily moved to the oxide semiconductor layer, thereby improving a photoconduction of the optical transistor according to an example embodiment.

Figure 5:
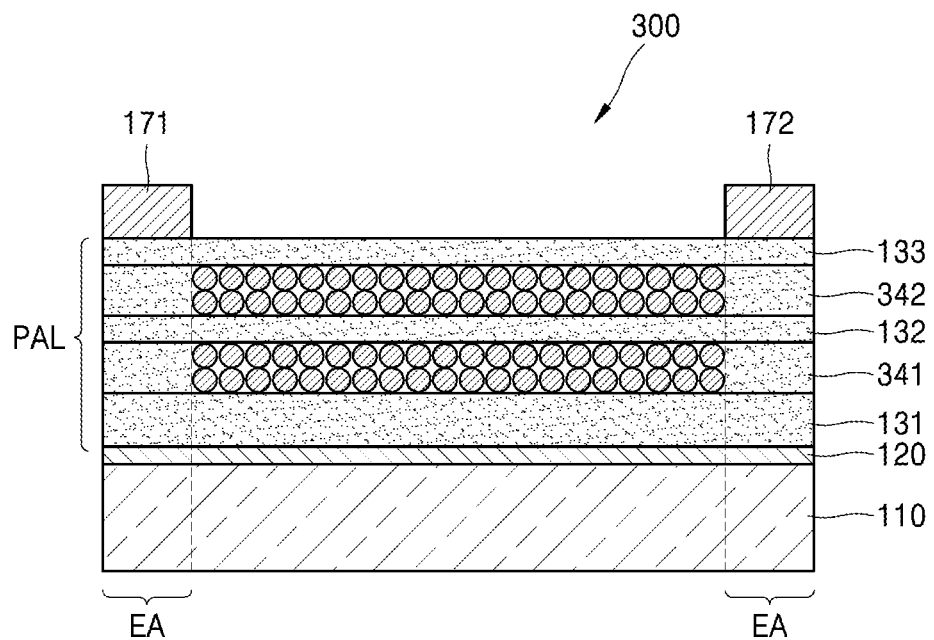
FIG. 5 is a cross-sectional view showing a structure of a photoelectric conversion device according to another example embodiment.

FIG. 5 is a cross-sectional view showing a structure of a photoelectric conversion device 300 according to another example embodiment. Like reference numerals are used to indicate elements that are substantially identical to the elements of FIG. 1, and thus the detailed description thereof will be omitted.

Referring to FIG. 5, the photoactive layer PAL of the photoelectric conversion device 300 includes two quantum dot layers 341 and 342 spaced apart from each other. The two quantum dot layers 341 and 342 are separated by a second oxide semiconductor layer 132 interposed therebetween. The quantum dot layers 341 and 342 respectively may have a multiple layer structure. For example, as depicted in FIG. 5, the quantum dot layers 341 and 342 respectively may have a double layer structure in which the double layers contact each other.

The quantum dot layers 341 and 342 generate a greater amount of carriers than the first and second quantum dot layers 141 and 142 which are single quantum dot layers. Accordingly, the responsivity of the photoelectric conversion device 300 may be improved.

In FIG. 5, it is depicted that two quantum dot layers 341 and 342 are respectively double layers, but the present example embodiment is not limited thereto. For example, the photoelectric conversion device 300 may include 2 to 10 quantum dot layers or more separated in a vertical direction with respect to a surface of a substrate 110, and each of the quantum dot layers may have a structure of doubled quantum dot layers that contact each other.

Figure 6:
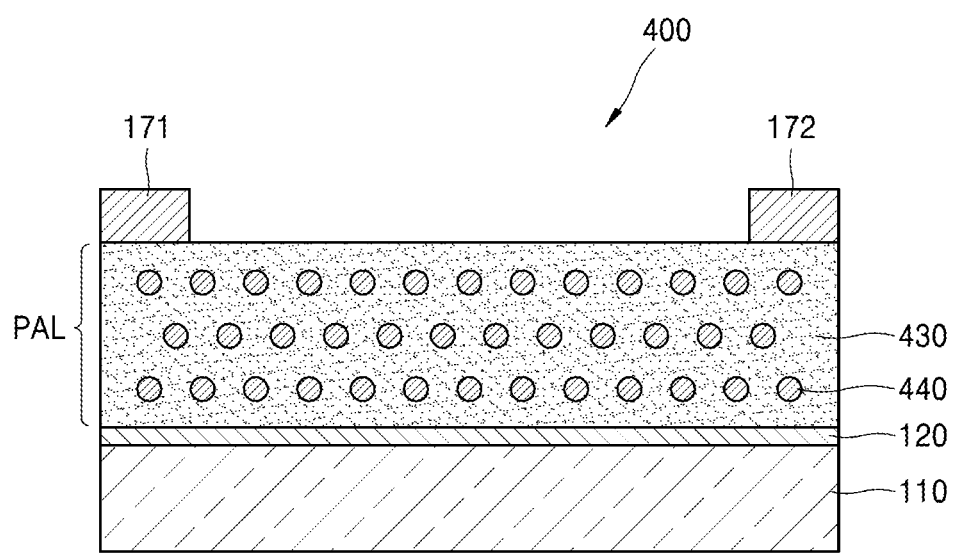
FIG. 6 is a cross-sectional view showing a structure of a photoelectric conversion device according to another example embodiment.

FIG. 6 is a cross-sectional view showing a structure of a photoelectric conversion device 400 according to an example embodiment. Like reference numerals are used to indicate elements that are substantially identical to the elements of FIG. 1, and thus the detailed description thereof will be omitted.

Referring to FIG. 6, the photoactive layer PAL of the photoelectric conversion device 400 includes an oxide semiconductor layer 430 on the insulating layer 120 and a plurality of quantum dots 440 embedded in the oxide semiconductor layer 430. The quantum dots 440 may be uniformly distributed in the oxide semiconductor layer 430. The photoactive layer PAL may be formed such that, after dispersing the quantum dots 440 in a liquid solution that includes an oxide semiconductor material, the liquid solution is coated on the insulating layer 120 by using a spray coating method.

In the photoelectric conversion device 400 according to the present example embodiment, charge separation is increased since an interface between quantum dots 440 and the oxide semiconductor layer 430 is increased, and thus, efficiency of the photoelectric conversion device 400 may be improved.

Figure 7:
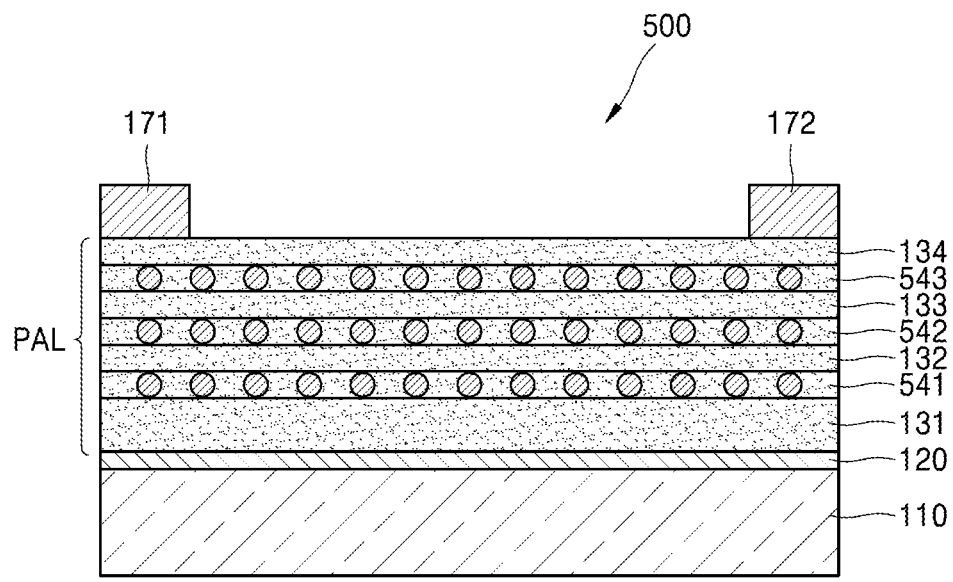
FIG. 7 is a cross-sectional view showing a structure of a photoelectric conversion device according to another example embodiment.

FIG. 7 is a cross-sectional view showing a structure of a photoelectric conversion device 500 according to another example embodiment. Like reference numerals are used to indicate elements that are substantially identical to the elements of FIG. 3, and thus the detailed description thereof will be omitted.

Referring to FIG. 7, the photoactive layer PAL of the photoelectric conversion device 500 includes a plurality of quantum dot layers 541, 542, and 543. Each of the quantum dot layers 541, 542, and 543 may be a sub-mono layer. Each of the quantum dot layers 341, 542, and 543 may be formed with approximately ½ to ¾ of the number of quantum dots required to form a complete mono-layer. That is, quantum dots of each of the quantum dot layers 541, 542, and 543 may occupy an area (or a volume) of approximately ½ to ¾ of the area (or a volume) of their corresponding quantum dot layer. Oxide semiconductor layers 132, 133, and 134 may fill a space between the quantum dots of the corresponding quantum dot layers 541, 542, and 543.

In the structure of the photoelectric conversion device 500, similar to the photoelectric conversion device 400, an interface between the quantum dots and the oxide semiconductor layers 132, 133, and 134 is increased, and thus, efficiency of the photoelectric conversion device 500 may be improved.

Figure 8:
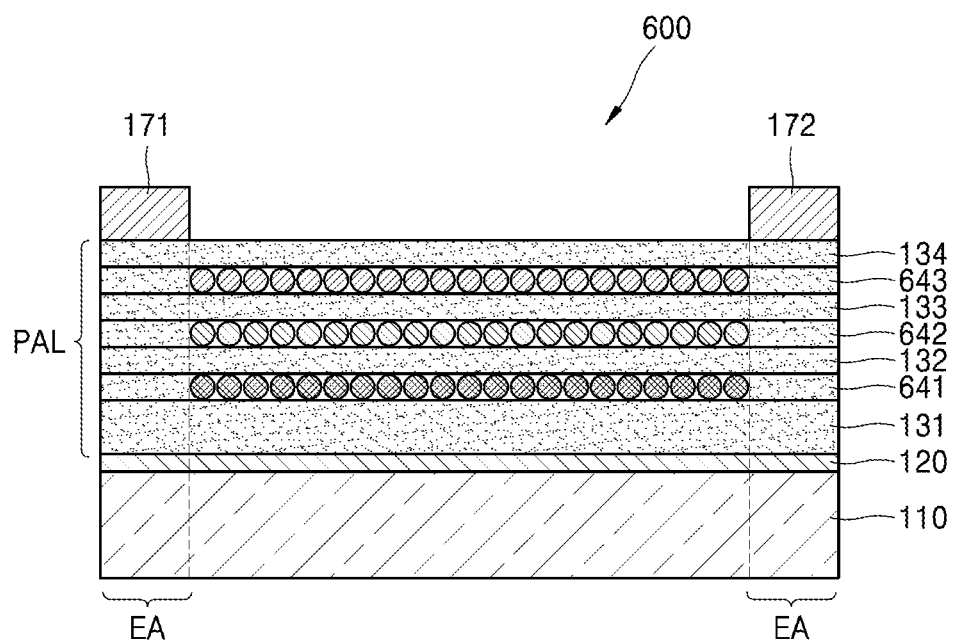
FIG. 8 is a cross-sectional view showing a structure of a photoelectric conversion device according to another example embodiment.

FIG. 8 is a cross-sectional view showing a structure of a photoelectric conversion device 600 according to another example embodiment. Like reference numerals are used to indicate elements that are substantially identical to the elements of FIG. 1, and thus the detailed description thereof will be omitted.

Referring to FIG. 8, the photoactive layer PAL of the photoelectric conversion device 600 includes at least three quantum dot layers, that is, first through third quantum dot layers 641, 642, and 643 on the insulating layer 120 between first through fourth oxide semiconductor layers 131, 132, 133, and 134. The quantum dot layers 641, 642, and 643 are sequentially spaced apart from the substrate 110. For example, as shown in FIG. 8, the first quantum dot layer 641 includes red quantum dots that generate charges by absorbing mainly red light, the second quantum dot layer 642 includes green quantum dots that generate charges by absorbing mainly green light, and the third quantum dot layer 643 includes blue quantum dots that generate charges by absorbing mainly blue light.

The photoelectric conversion device 600 may absorb visible light of a wide spectrum, and thus, the responsivity of the photoelectric conversion device 600 may be increased.

Figure 9:
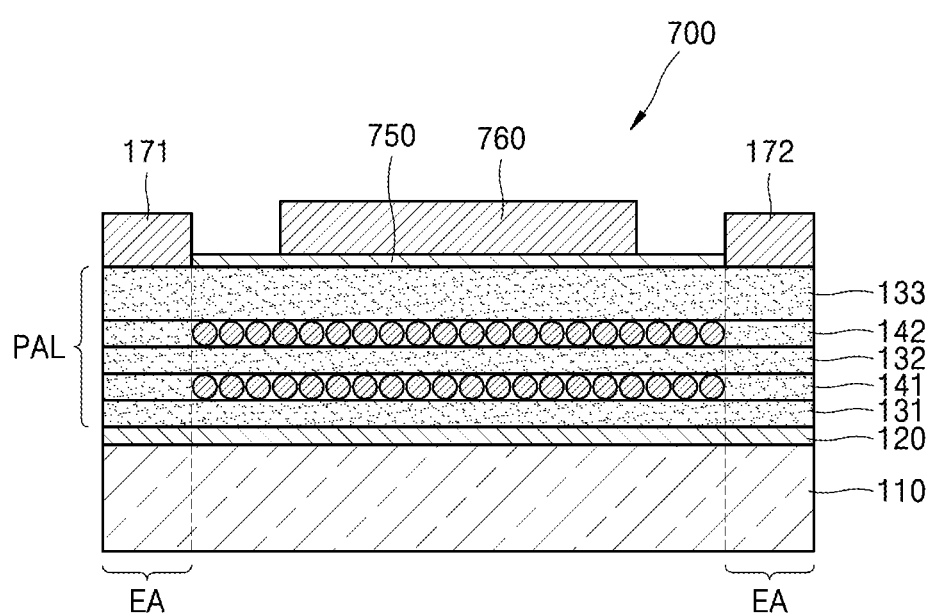
FIG. 9 is a schematic cross-sectional view showing a structure of a photoelectric conversion device according to an example embodiment.

FIG. 9 is a schematic cross-sectional view showing a structure of a photoelectric conversion device 700 according to another example embodiment. Like reference numerals are used to indicate elements that are substantially identical to the elements of FIG. 1, and thus the detailed description thereof will be omitted.

Referring to FIG. 9, a gate insulating layer 750 is formed on the photoactive layer PAL, and a gate electrode 760 is formed on the gate insulating layer 750. The third oxide semiconductor layer 133 may be a main channel. The third oxide semiconductor layer 133 may be formed to have a thickness greater than those of the first and second oxide semiconductor layers 131 and 132. The third oxide semiconductor layer 133 may have a thickness in a range from about 10 nm to about 20 nm, and the first and second oxide semiconductor layers 131 and 132 may have a thickness in a range from about 5 nm to about 10 nm.

The substrate 110 may be a plastic substrate. The plastic substrate may be used for forming a flexible transistor. However, the present example embodiment is not limited thereto. The substrate 110 may be a silicon substrate, a glass substrate, etc.

The gate insulating layer 750 may include a material generally used in the semiconductor process. The gate insulating layer 750 may include, for example, a silicon oxide or a silicon nitride. Also, in order to manufacture a flexible transistor, the gate insulating layer 750 may include a polymer or an amorphous silicon oxide.

The gate electrode 760 may be a transparent electrode so that light is irradiated thereto. For example, the gate electrode 760 may include indium tin oxide (ITO).

The photoelectric conversion device 700 may be a top gate optical transistor.

Also, the photoelectric conversion devices 200, 300, 400, 500, and 600 may further include a gate insulating layer and a gate electrode sequentially formed between the first electrode 171 and the second electrode 172 on an upper surface of the photoactive layer PAL like in the photoelectric conversion device 700.

In a photoelectric conversion device according to an example embodiment, numbers of quantum dots that generate carriers by receiving light are increased. Since a contact area between quantum dots and oxide semiconductor layers is increased, charge separation efficiency is increased, and as a result, photon sensitivity of the photoelectric conversion device is improved.

In a photoelectric conversion device according to example embodiments, as the number of quantum dots increase, the amount of charges (e.g., carriers) in the quantum dots is increased, and as an interface between quantum dots and oxide semiconductor layers is increased, charge separation efficiency is increased in the quantum dots. Thus, generated (i.e., separated) charges (e.g., carriers) may be readily moved to the oxide semiconductor layers, and thus, photoconduction is increased, and as a result, photon responsivity of the photoelectric conversion device is improved.

While one or more embodiments have been described with reference to the figures, it will be understood by those of ordinary skill in the art that various changes in form and details may be made therein without departing from the spirit and scope as defined by the following claims.

What is claimed is:

1. A photoelectric conversion device comprising:
   a substrate;
   a photoactive layer disposed on the substrate, the photoactive layer comprising:
     a first oxide semiconductor layer, and
     a plurality of second oxide semiconductor layers and a plurality of quantum dot layers alternately formed on the first oxide semiconductor layer; and
     a first electrode and a second electrode respectively connected to corresponding edges of the photoactive layer,
     wherein the plurality of second oxide semiconductor layers and the plurality of quantum dot layers are sequentially stacked on the first oxide semiconductor layer, and
     wherein the first electrode and the second electrode are arranged only on an upper surface of an uppermost second oxide semiconductor layer among the plurality of second oxide semiconductor layers to only connect to the uppermost second oxide semiconductor layer.

2. The photoelectric conversion device of claim 1, wherein the plurality of quantum dot layers are arranged spaced apart from each other by a distance in a range of 5 nm to 10 nm, in a vertical direction with respect to the substrate.

3. The photoelectric conversion device of claim 1, wherein electrode regions in the plurality of quantum dot layers below the first electrode and the second electrode are filled with an oxide semiconductor.

4. The photoelectric conversion device of claim 1, wherein the plurality of quantum dot layers include 2 to 10 quantum dot layers.

5. The photoelectric conversion device of claim 1, wherein quantum dots in each of the plurality of quantum dot layers occupy ½ to ¾ of an area of their corresponding quantum dot layer.

6. The photoelectric conversion device of claim 1, wherein quantum dots in the plurality of quantum dot layers comprise CdS, CdSe, CdTe, ZnS, ZnSe, ZnTe, ZnO, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, CdHgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe, Si, Ge, SiC, SiGe, or a combination of at least two of these materials.

7. The photoelectric conversion device of claim 1, wherein each quantum dot in the plurality of quantum dot layers has at least one of a core structure, a core-shell structure, and a core-shell-shell structure.

8. The photoelectric conversion device of claim 1, wherein each quantum dot in the plurality of quantum dot layers comprises at least one of a CdSe core structure, an InP core structure, a CdSe/CdS core-shell structure, an InP/ZnS core-shell structure, and a CdSe/CdS/ZnS core-shell-shell structure.

9. The photoelectric conversion device of claim 1, wherein each of the plurality of quantum dot layers comprises double quantum dot layers that are in contact with each other.

10. The photoelectric conversion device of claim 1, wherein the plurality of quantum dot layers comprise a first quantum dot layer that absorbs red light, a second quantum dot layer that absorbs green light, and a third quantum dot layer that absorbs blue light, which are spaced apart from each other.

11. The photoelectric conversion device of claim 1, further comprising a gate insulating layer interposed between the substrate and the first oxide semiconductor layer, wherein the substrate functions as a gate electrode.

12. The photoelectric conversion device of claim 1, wherein the first oxide semiconductor layer has a first thickness greater than a second thickness of at least one of the plurality of second oxide semiconductor layers.

13. The photoelectric conversion device of claim 1, further comprising a gate insulating layer and a gate electrode that are sequentially formed on an uppermost second oxide semiconductor layer among the plurality of second oxide semiconductor layers.

14. The photoelectric conversion device of claim 13, wherein the uppermost second oxide semiconductor layer among the plurality of second oxide semiconductor layers has a first thickness greater than a second thickness of the first oxide semiconductor layer and remaining second oxide semiconductor layers of the plurality of second oxide semiconductor layers.

* * * * *